(12) United States Patent
Schwarzl

(10) Patent No.: US 6,605,837 B2
(45) Date of Patent: Aug. 12, 2003

(54) MEMORY CELL CONFIGURATION AND PRODUCTION METHOD

(75) Inventor: Siegfried Schwarzl, Neubiberg (DE)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 09/940,087

(22) Filed: Aug. 27, 2001

(65) Prior Publication Data

US 2002/0020864 A1 Feb. 21, 2002

Related U.S. Application Data

(63) Continuation of application No. PCT/DE00/00310, filed on Feb. 1, 2000.

(30) Foreign Application Priority Data

Feb. 26, 1999 (DE) .......................................... 199 08 519

(51) Int. Cl.[7] .............................................. H01L 29/76
(52) U.S. Cl. .................................... 257/296; 257/368
(58) Field of Search .................................. 257/296, 421, 257/368; 365/145, 171

(56) References Cited

U.S. PATENT DOCUMENTS

| | | | |
|---|---|---|---|
| 5,477,482 A | 12/1995 | Prinz | |
| 5,541,868 A | 7/1996 | Prinz | |
| 5,587,943 A | 12/1996 | Torok et al. | |
| 5,969,978 A | 10/1999 | Prinz | |
| 6,473,275 B1 | * 10/2002 | Gill | |
| 6,521,931 B2 | * 2/2003 | Sandhu et al. | |

FOREIGN PATENT DOCUMENTS

| WO | PCT/US96/01653 | 8/1996 |
|---|---|---|
| WO | WO-98/10423 | * 12/1998 |

OTHER PUBLICATIONS

Tang et al.: "An IC process compatible Nonvalatile Magnetic RAM" IEDM 95, pp. 997–999.
Mengel: "XMR Technologien—Technologiefrüherkennung" [XMR Technologies—technology early detection] VDI, Technologieanalyse Magnetismus Band, Aug. 2, 1997 (incomplete) pp. 1–80.
Daughton: "Magnetoresistive memory technology" Thin Solid Films, vol. 216, 1992, pp. 162–168.
Wang: "A new type of GMR memory", Journal of Magnetism and Magnetic Materials, vol. 155, pp. 161–163.
Hu et al.: "Chemical–mechanical polishing as an enabling technology for giant magnetoresistance devices", Thin Solid Films, vol. 308–107, 1997, pp. 555–561.

* cited by examiner

Primary Examiner—Stephen D. Meier
(74) Attorney, Agent, or Firm—Laurence A. Greenberg; Werner H. Stemer; Gregory L. Mayback

(57) ABSTRACT

A memory cell configuration includes a magnetoresistive element with an annular cross-section in a layer plane, a first line and a second line. The first and second lines crossing each other. The magnetoresistive element is disposed in the crossing region between the first line and the second line. The first line and/or the second line include at least one first portion, in which the predominant current component is oriented parallel to the layer plane, and one second portion, in which the predominant current component is oriented perpendicular to the layer plane.

19 Claims, 14 Drawing Sheets

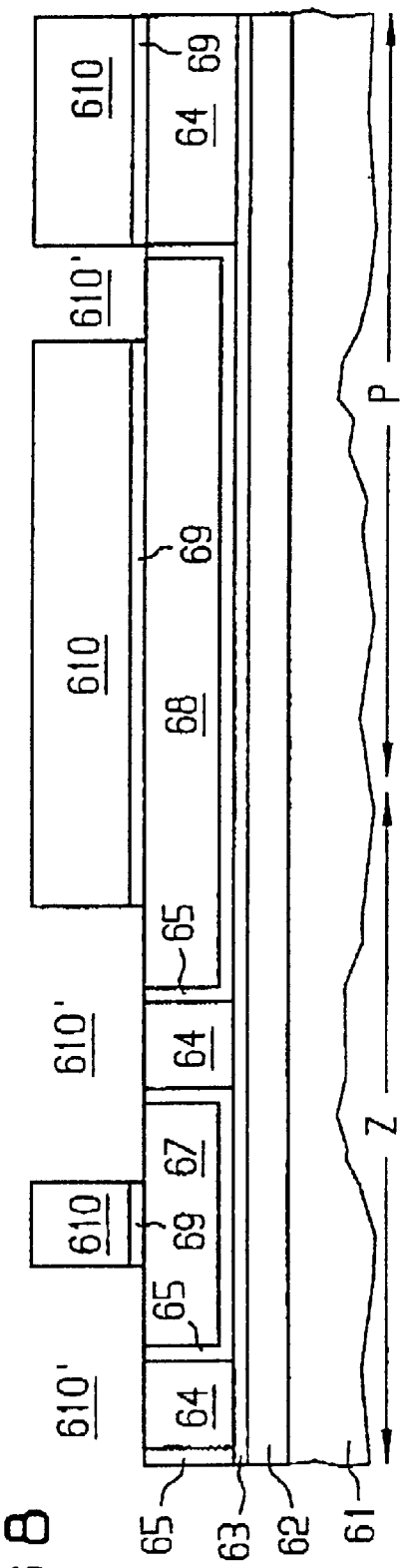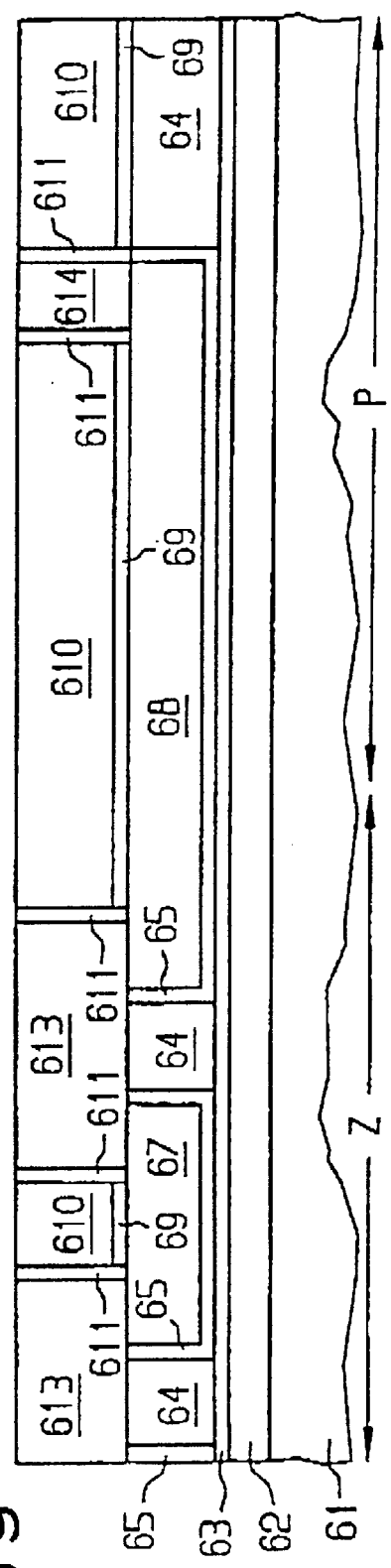

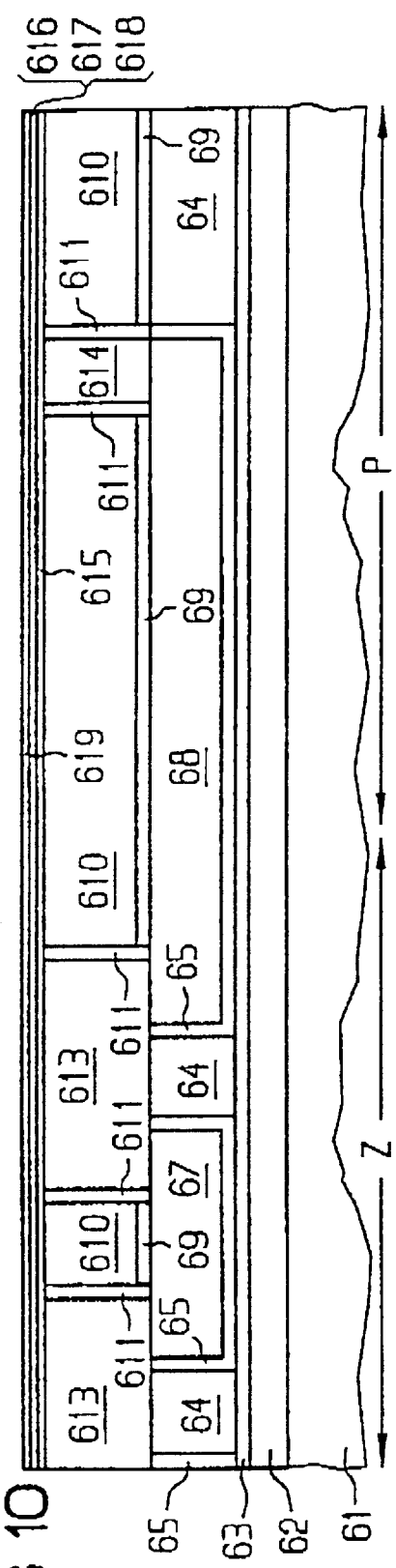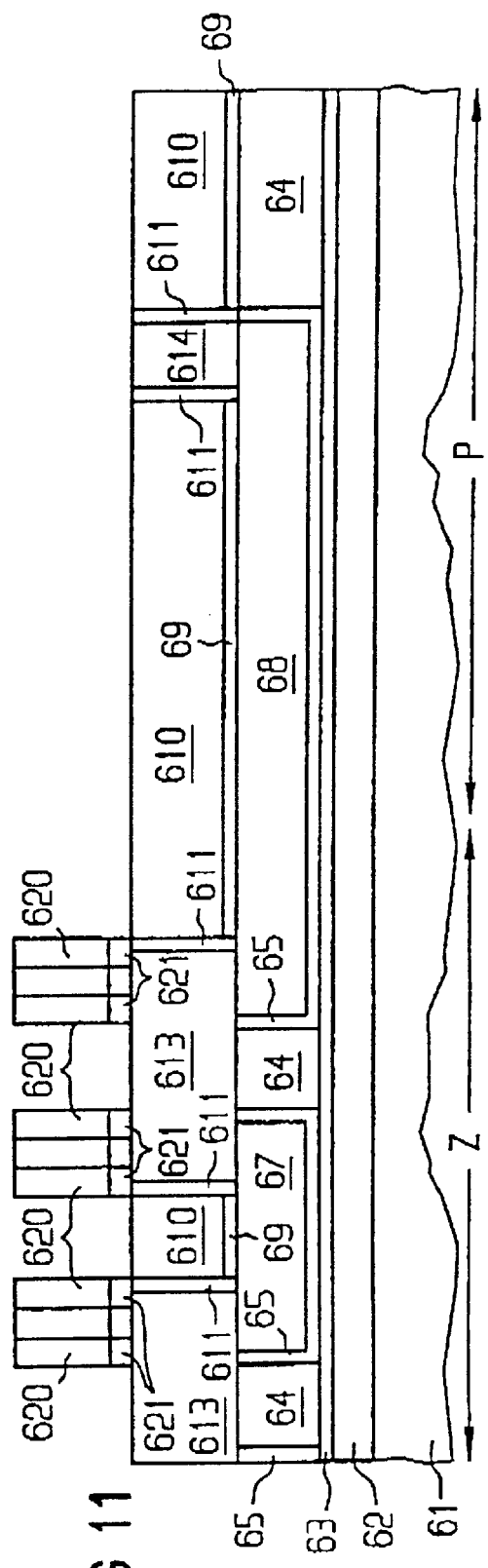

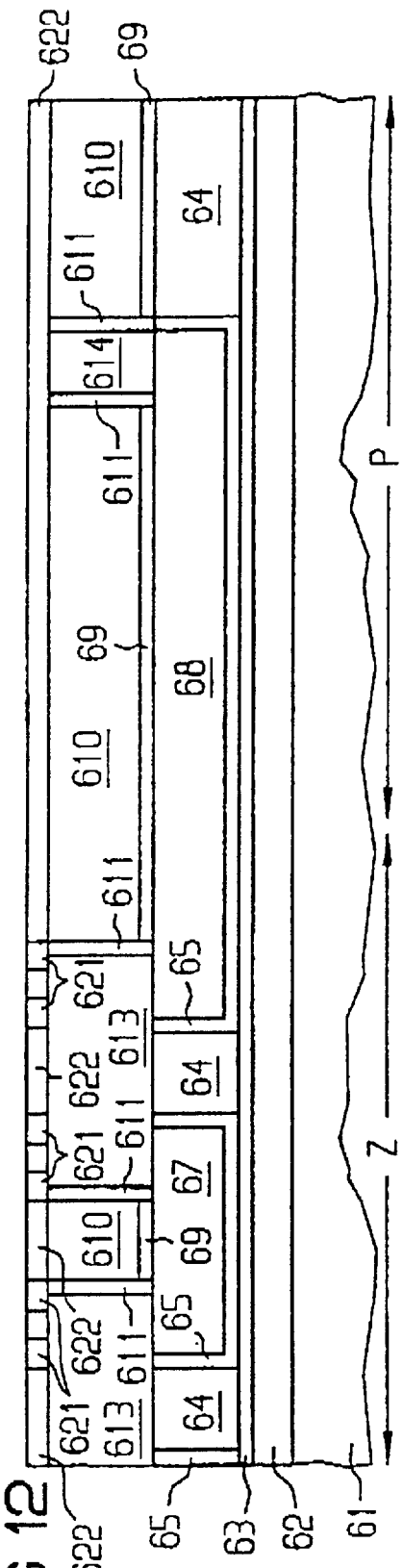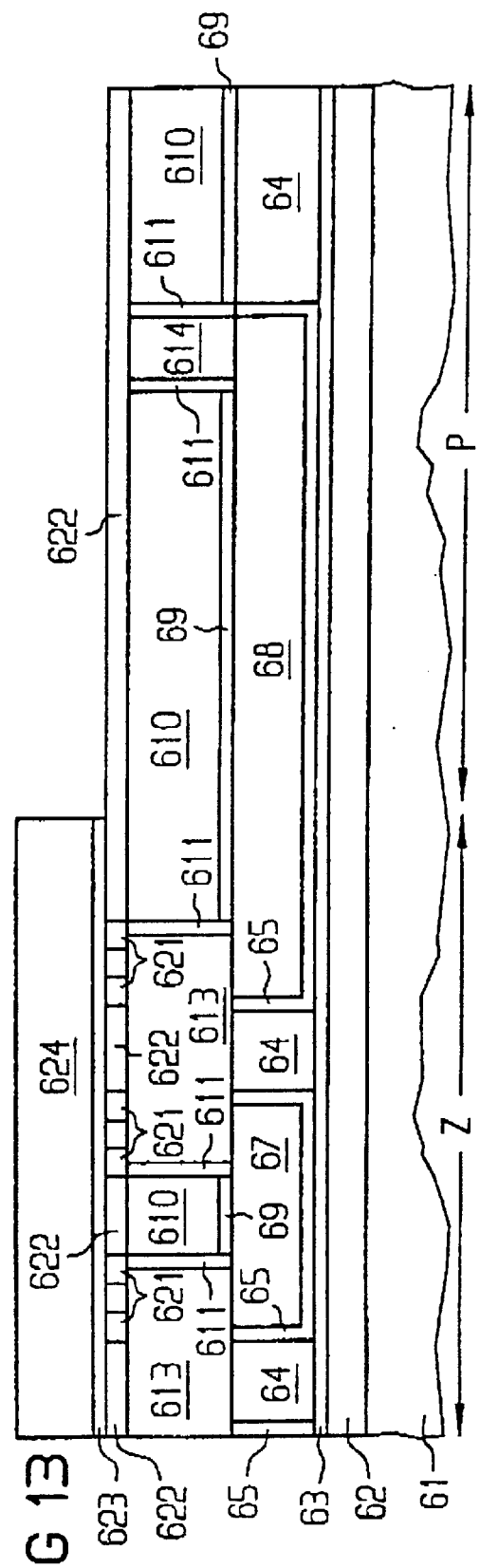

MEMORY CELL CONFIGURATION AND PRODUCTION METHOD

CROSS-REFERENCE TO RELATED APPLICATION

This application is a continuation of copending International Application No. PCT/DE00/00310, filed Feb. 1, 2000, which designated the United States.

BACKGROUND OF THE INVENTION

Field of the Invention

The invention relates to a memory cell configuration including at least one magnetoresistive element, and a PRODUCTION METHOD.

Within the specialty, the term magnetoresistive element refers to a structure that includes at least two ferromagnetic layers and one intermediate non-magnetic layer. GMR elements, TMR elements, and CMR elements are distinguished according to their layer structures (see S. Mengel, "Technologieanalyse Magnetismus", Vol. 2, *XMR Technologies*, VDI Technologiezentrum Physikalische Technologien (August 1997)).

The term GMR element is used for layer structures that include at least two ferromagnetic layers and one intermediate nonmagnetic conductive layer and that exhibit what is known as GMR (Giant Magnetoresistance). GMR effect refers to the fact that the electrical resistance of the GMR element is dependent upon whether the magnetizations in the two ferromagnetic layers are oriented parallel or anti-parallel relative to each other. GMR effect is large compared to what is known as AMR effect (Anisotropic Magnetoresistance). AMR effect refers to the fact that the resistance in magnetized conductors is different parallel to the magnetization direction and perpendicular to it. AMR effect is a matter of a volume effect that emerges in the ferromagnetic monolayers.

The term TMR element is used for tunneling magnetoresistance layer structures that include at least two ferromagnetic layers and one intermediate insulating, non-magnetic layer. The insulating layer is so thin that a tunnel current is induced between the two ferromagnetic layers. These layer structures likewise exhibit a magnetoresistive effect, which is effectuated by a spin-polarized tunnel current through the insulating non-magnetic layer that is disposed between the two ferromagnetic layers. In this case, also, the electrical resistance of the TMR element depends upon whether the magnetizations in the two ferromagnetic layers are oriented parallel or antiparallel to each other. The relative change in resistance equals from 6% to approx. 40% at room temperature.

Another magnetoresistance effect, which is called CMR (Colossal Magnetoresistance) due to it size (relative change in resistance of from one-hundred to four-hundred percent (100–400%) at room temperature), requires a high magnetic field for switching between the magnetization states owing to its high coercive forces.

The utilization of GMR elements as storage elements in a memory cell configuration has been suggested (see e.g. D. D.

Tang et al, *IEDM* 95, pp. 997–99; J. M. Daughton, *Thin Solid Films*, v. 216 (1992): 162–68; Z. Wang et al, *Journal of Magnetism and Magnetic Materials*, v. 155 (1996): 161–63). The storage elements are connected in series by way of read lines. Extending perpendicular to these are word lines, which are insulated against both the read lines and the storage elements. Due to the current flowing in each word line, signals that are applied to the word lines bring about a magnetic field, which, if it is strong enough, influences the underlying storage elements. For writing information, x/y lines are used, which cross at the memory cell that is being written. They are charged with signals that produce a sufficient magnetic field at the crossing to cause remagnetization. In this process, the magnetization direction in one of the two ferromagnetic layers is switched. By contrast, the magnetization direction in the other of the two ferromagnetic layers remains unchanged. The magnetization direction in the latter ferromagnetic layer is maintained with the aid of a neighboring antiferromagnetic layer, which keeps the magnetization direction fixed, or by increasing the switching threshold for this ferromagnetic layer using a different material or a different dimensioning, for instance layer thickness, compared to the former ferromagnetic layer.

U.S. Pat. No. 5,541,868 to Prinz and U.S. Pat. No. 5,477,482 to Prinz propose annular storage elements based on GMR effect. A storage element includes a stack having at least two annular ferromagnetic layer elements and one intermediately disposed non-magnetic conductive layer element connected between two lines. The ferromagnetic layer elements have different material compositions. One of the ferromagnetic layer elements is magnetically hard, while the other is magnetically softer. To write the information, the magnetization direction in the magnetically softer layer element is switched, while the magnetization direction in the magnetically harder layer element is maintained.

Another memory cell configuration containing annular storage elements based on GMR effect is taught in International Publication WO 96/25740. These include layer elements composed of two magnetic materials, one of which has a high coercive strength, and the other of which has a low coercive strength. To actuate the magnetoresistive element, two driver lines are provided, both of which run through the middle of the annular GMR element. The switching of the magnetization direction is accomplished with the aid of a magnetic field that is induced by currents in the two driver lines.

For purposes of switching the magnetization direction, a current flows between the two lines between which the GMR element is connected and also via the storage element. The magnetic field that is induced by this current is used for modifying the magnetization direction.

Because the two driver lines run through the middle of the annular GMR element and must be insulated against each other, the packing density that can be achieved with this configuration is limited.

SUMMARY OF THE INVENTION

It is accordingly an object of the invention to provide a memory cell configuration and PRODUCTION METHOD that overcomes the hereinafore-mentioned disadvantages of the heretofore-known devices of this general type and that provides a memory cell configuration having at least one magnetoresistive element. Such a configuration is insensitive to external magnetic interference fields, functional for magnetoresistive element s with both TMR and GMR effects, and producible with higher packing densities than the prior art. Furthermore, a method is laid out for producing such a memory cell configuration.

With the foregoing and other objects in view, there is provided, in accordance with the invention, a memory cell configuration. The memory cell configuration includes a first line, a second line, and a magnetoresistive element. The second line is crossed by the first line to define a crossing region. The magnetoresistive element has an annular cross-section in a layer plane and layer elements stacked perpendicular to the layer plane. The magnetoresistive element is disposed in the crossing region. The first line and the second line are disposed in the crossing region on opposing sides of the magnetoresistive element relative to the layer plane. At least one of the first line and the second line including at least one first portion has a predominant current component oriented parallel to the layer plane and one second portion having a predominant current component oriented perpendicular to the layer plane, in the overlap region.

With the objects of the invention in view, there is also provided a method for producing a memory cell configuration including the following steps. The first step is creating a first line on a main surface of a substrate. The next step is forming a magnetoresistive element exhibiting an annular cross-section in a layer plane by depositing and structuring a first ferromagnetic layer, a non-magnetic layer, and a second ferromagnetic layer. The next step is disposing the magnetoresistive element in the crossing region by creating a second line crossing the first line. The next step is creating at least one of said first line and said second line in the overlap region. The next step is including a first portion of said at least one of said first line and said second line in the overlap region with a predominant current component oriented parallel to the layer plane, and a second portion with a predominant current component oriented perpendicular to the layer plane.

The memory cell configuration includes at least one magnetoresistive element, whose cross-section in a layer plane is annular. The magnetoresistive element includes layer elements that are stacked perpendicular to the layer plane. The utilization of a magnetoresistive element with an annular cross-section guarantees a higher insensitivity to external magnetic interference fields, because external magnetic interference fields are rather homogenous over the extent of the annular element and thus substantially without effect. Given the use of $\mu$-metal, additional shielding measures can be forgone.

Since there is a closed magnetic flux in an annular ferromagnetic layer element, magnetic leakage fields escape to the outside environment most frequently during the remagnetization process. Therefore, layer elements of a magnetoresistive element or adjoining elements are almost entirely magnetically decoupled. Thus, a plurality of identical magnetoresistive elements can be provided in the memory cell configuration in a high packing density.

Annular layer elements exhibit two stable magnetization states; i.e., the magnetization flux is closed either in the clockwise or counterclockwise direction. Both states are very stable, and the transitions from one into the other are insensitive to defects and geometric irregularities. The probability of information losses due to irreversible magnetization processes is thus lower than in conventional, singly integrated element structures.

The memory cell configuration also includes a first line and a second line, which cross. In the crossing region between the first and second lines, the magnetoresistive element is disposed. The first and second lines are thus disposed at the crossing on different sides of the magnetoresistive element relative to the layer plane. The first and/or second lines include at least one first and one second line portion. The first line portion is oriented such that the predominant current component therein is aligned parallel to the layer plane, whereas the predominant current component in the second line portion in the crossing region between the first and second lines is aligned perpendicular to the layer plane. Specifically, the first portion runs parallel to the layer plane, and the second line portion crosses a plane that is parallel to the layer plane in the crossing region between the first and second lines. In particular, the first line and/or the second line are bent perpendicular to the layer plane.

At the location of the annular magnetoresistive elements, the currents flowing through the so-constructed lines generate a magnetic field that is suitable for remagnetizing the magnetoresistive elements in the write operation. Both the azimuthal (circular) magnetic fields of the vertical current components in the layer plane and the lateral magnetic field components of the parallel current components, i.e. the magnetic field components, which are oriented in the layer plane perpendicular to the longitudinal direction of the line, contribute to the remagnetization field. The current components that are parallel to the layer plane contribute to remagnetization because the first line portions of the first and second lines are different distances from the annular magnetoresistive element and thus do not compensate each other.

By virtue of these types of lines, it is possible to realize memory cell configurations that can be produced more easily and with larger packing densities than hitherto. The first and second lines, which cross at the location of the storage element, are sufficient for writing and reading. Additional lines, for instance through the annular storage elements, are not necessary, in contrast to the solution known from WO 96/25740. The result is a lower surface consumption per memory cell.

Furthermore, the memory cell configuration can be realized either with a magnetoresistive element based on GMR effect or a magnetoresistive element based on TMR effect, since, unlike the solution known from U.S. Pat. Nos. 5,477,482 and 5,541,868, no current is needed across the magnetoresistive element for generating the magnetic switching field.

Both the first and second lines expediently include at least one first portion in which the predominant current component is oriented parallel to the layer plane and one second portion in which the predominant current component is oriented perpendicular to the layer plane. If the first and second lines are wired up in such a way that the current through the second portion of the first line and the current through the second portion of the second line flow in the same direction, the azimuthal magnetic fields of these currents constructionally overlap and reinforce one another at the location of the magnetoresistive element. This makes selective writing in memory cell fields possible.

If the magnetoresistive element is interposed between the first and second lines, the stored information can be read over the first and second lines. To accomplish this, the resistance of the magnetoresistive element is evaluated. This can be accomplished by measuring the absolute resistance of the magnetoresistive element, measuring the change in resistance in the switching of the magnetoresistive element, or comparing the resistance to a neighboring magnetoresistive element's known magnetization state. Any method of evaluating the resistance of the magnetoresistive element is suitable for reading the stored information.

The magnetoresistive element expediently includes a first ferromagnetic layer element, a non-magnetic layer element, and a second ferromagnetic layer element, respectively, whereby the non-magnetic layer element is disposed between the first and second ferromagnetic layer elements.

The magnetoresistive element can be based on either GMR or TMR. The utilization of a TMR magnetoresistive element is preferable, owing to the relatively larger resistance, the consequent reduction in power consumption, and the usually larger magnetoresistance effect. Beyond this, the magnetoresistive element can be based on a CMR effect, provided that the configuration is able to generate the required magnetic switching fields.

The first ferromagnetic layer element and the second ferromagnetic layer element expediently contain at least one of the following elements: Fe, Ni, Co, Cr, Mn, Gd, Dy, and Bi. The first ferromagnetic layer element and the second ferromagnetic layer element differ with respect to magnetic hardness and/or layer thickness.

The first and second ferromagnetic layer elements expediently have a thickness of between 2 nm and 20 nm perpendicular to the layer plane. In the case of a TMR effect, the nonmagnetic layer element expediently contains $Al_2O_3$, NiO, $HfO_2$, $TiO_2$, NbO, or $SiO_2$, individually or in combination, and forms a thickness of between 1 and 4 nm perpendicular to the layer plane. In the case of a GMR element, the non-magnetic layer element expediently contains Cu, Au, Ag or Al, individually or in combination, and forms a thickness of between 2 and 5 nm perpendicular to the layer plane. The first ferromagnetic layer element, the second ferromagnetic layer element, and the non-magnetic layer element have dimensions between 50 and 400 nm parallel to the layer plane.

For storing large quantities of data, the memory cell configuration includes a number of identical magnetoresistive elements disposed in a matrix. In addition, a number of identical first lines and identical second lines are provided. The first and second lines cross. Each magnetoresistive element is disposed in the crossing region between one of the first lines and one of the second lines. The first and/or second lines each include first portions, in which the predominant current component is oriented parallel to the layer plane, and second portions, in which the predominant current component is oriented perpendicular to the layer plane, in alternation. Because the annular magnetoresistive elements are nearly magnetically decoupled, a high packing density can be achieved.

Preferably, both the first and second lines include first and second portions, so that a selective writing into the individual memory cells is possible.

In accordance with a development of the invention, the first and second portions of one of the first lines and/or one of the second lines are disposed in such a way that the appertaining line has a strip-shaped cross-section parallel to the layer plane. In this development, a surface consumption of 4 $F^2$ per cell can be achieved, F being the minimum structural size that can be produced in the respective technology, to the extent that both the width of the lines parallel to the layer plane and the spacing between adjoining lines equal F. In this configuration, the overlap of the by the vertical current components in the first and/or second lines produces an azimuthal magnetic field in the layer plane at the location of each annular storage element. This field is primarily responsible for the remagnetization of the annular magnetoresistive elements. Magnetic field contributions, which stem from the current components that are parallel to the layer plane, lead to an asymmetry of the resulting magnetic switching field, which has a positive effect with respect to reducing switching field thresholds.

In a separate development of the memory cell configuration, the magnetoresistive elements are disposed in rows and columns between the first and second lines, and the layer plane spreads through the center planes of the magnetoresistive elements. The direction of the rows and the direction of the columns run parallel to the layer plane, whereby the direction of the rows crosses the direction of the columns. The projections of the first portions of one of the first lines on the layer plane are respectively disposed between adjoining magnetoresistive elements of this row in such a way that the projections are laterally staggered relative to the connecting lines through the magnetoresistive elements of these cells. The projection of the first portions of one of the second lines on the layer plane is disposed between adjoining magnetoresistive elements of one of the columns, whereby the projection is laterally offset relative to a connecting line between the adjoining magnetoresistive elements. The projections of first portions, which are adjacently disposed along one of the lines, on the layer plane are set off to opposite sides relative to the respective connecting lines. The projections of the first and second lines on the layer plane are therefore wavy instead of being elongated rectangles. In this development, double-digit symmetrical local azimuthal magnetic fields are produced at the location of the magnetoresistive elements. The per-cell surface consumption equals 9 $F^2$.

In this development of the memory cell configuration, magnetic switching fields of greater symmetry, namely double-digit symmetry, are generated in the layer plane at the location of the annular elements. This development expediently includes the following features:

The projection of the first and second lines on the layer plane are strips whose center lines and margins are parallel wavy polygonal lines.

The structures in the wavy strips repeat periodically, whereby the wavy strips oscillate about a center longitudinal direction.

The adjoining projection strips of the first and second lines are offset relative to one another by a half-period in the longitudinal direction.

The projection strips of the first lines cross those of the second lines at the "zeroes" of the wave strips, whereby the center longitudinal directions form a right angle, though the strips extend parallel to one another section by section. The respective crossing of the projection strip with the respective center longitudinal direction is referred to as the zero.

The annular magnetoresistive elements are disposed in the layer plane in rows and columns at the crossings between the first and second lines.

The first and second lines are bent perpendicular to the layer plane at the crossings, so that second line portions having vertical current components exist at these locations.

Given the constructional overlap of the magnetic fields generated by the vertical current components of the first and second lines, and given sufficient current intensities, double-digit symmetrical switching fields can be generated at the location of the annular magnetoresistive elements in this configuration.

This development can be realized with a per-cell surface consumption of 9 $F^2$. To this end, the memory cell configuration includes the following additional features:

The period of the wavy strips equals 6F; their amplitude equals F/2.

The strips have a minimum width perpendicular to their longitudinal direction, and a minimum spacing, of F.

The projection strips of the first and second lines extend parallel to one another in segments with a length of F.

The annular storage elements are disposed in rows and columns in the layer plane at the crossings between the first and second lines at intervals of 3F.

To produce the memory cell configuration, a first line is created on a main surface of a substrate. The magnetoresistive element, which has an annular cross-section in a layer plane, is formed by depositing and structuring a first ferromagnetic layer, a non-magnetic layer, and a second ferromagnetic layer. A second line is created, which crosses the first line in such a way that the magnetoresistive element is disposed in the crossing region. The first line and/or the second line are created such that they include at least one first portion, in which the predominant current component is oriented parallel to the layer plane, and a second portion, in which the predominant current component is oriented perpendicular to the layer plane.

The first ferromagnetic layer, the non-magnetic layer, and the second ferromagnetic layer are preferably structured with the aid of the same mask.

To structure the annular magnetoresistive element, a self-aligning process is preferably used. To accomplish this, an opening is created in a layer that is disposed at a main surface of a substrate, and a conformal layer is deposited over the edges of said opening. Upon the anisotropic etchback of the conformal layer, an annular spacer emerges at the edges, which is used as a mask for the anisotropic structuring. If the opening is created with a dimension of F, magnetoresistive elements can be produced with an outer diameter of F and an inner diameter of less than F.

The first and second lines are preferably produced in two steps. First the lower segments of the first or second line are produced, and then the upper segments of the first or second line are produced. The projection of the lower segments and the projection of the upper segments of the respective line on the main surface of the substrate partially overlap, so that contiguous and bent first and second lines emerge. The second portions, in which vertical current components relative to the layer plane occur, emerge in the overlap regions of the lower and upper segments of the respective line. Intervening parts of the lower segments and upper segments represent the first portions, which extend parallel to the layer plane.

In the production of the lower segments of the first and second lines, a first metallization plane, which is usually referred to by experts as metal 1, and a second metallization plane, which is usually referred to as metal 2, are simultaneously formed in the periphery of the memory cell configuration. In the production of the top segments of the first and second lines, first contacts, referred to as Via 1, and second contacts, referred to as Via 2, are simultaneously formed in the periphery.

The first lines of the cell field are expediently bonded by way of the first metallization plane of the periphery, and the second lines of the cell field are bonded by way of the second metallization plane.

The first and second lines are expediently produced using the Damascene technique. To this end, a first insulating layer is deposited and then structured with the aid of photolithography steps and anisotropic plasma etching steps (RIE) so as to be removed in the region of the subsequently created first metallization plane of the periphery and lower segments of the first lines of the cell field. A first conductive layer or a first conductive layer system is deposited and structured by a planarizing etching technique, for instance CMP. The lower segments of the first lines and the first metallization planes of the periphery are formed in this way. Next, a second insulating layer is deposited and structured with the aid of photolithography steps and anisotropic etching steps so as to be removed in the region of the subsequently produced first contacts of the periphery and upper segments of the first line. The first contacts and the upper segments of the first line are formed by depositing a second conductive layer or a second conductive layer system and structuring it by a planarization technique such as CMP.

In a corresponding manner, the lower segments of the second line and the second metallization plane of the periphery are formed by depositing and structuring a third insulating layer and a third conductive layer or layer system, and the upper segments of the second line and the second contacts of the periphery are formed by depositing and structuring a fourth insulating layer and a fourth conductive layer.

Because the first and second lines are each produced in two steps, the production of the memory cell configuration can be easily integrated into a multi-layer wiring process. The deposition and structuring steps that are required in order to produce the peripheral metallization planes and the contacts that are needed between them (also known as vias), are also used to form the lower and upper segments of the first and second lines. The formation of the lower and upper segments of the first lines of the cell field in the same procedure as the first metallization plane (metal 1) and the first contact plane (via 1) of the periphery. Similarly, the lower and upper segments of the second lines are formed simultaneously with the second metallization plane (metal 2) and the second contact plane (via 2).

This procedure also solves the technical problem that a much larger vertical spacing exists between mutually overlying metallization planes of the periphery than between the first and second lines of the cell field. The vertical spacing between the first and second lines in the cell field is determined by the dimensions of the magnetoresistive element, which typically equal 20 to 40 nm. The spacing between adjoining metallization planes of the periphery must be significantly larger in order to reduce parasitic capacitances. In a 0.35-$\mu$m technology, it typically equals 350 to 400 nm. The inventive method solves this problem without additional metallization planes, additional topography, or vias with large aspect ratios.

Other features which are considered as characteristic for the invention are set forth in the appended claims.

Although the invention is illustrated and described herein as embodied in a memory cell configuration and PRODUCTION METHOD, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a sectional view through the substrate shown in FIG. 7 subsequent to the deposition and structuring of a second $Si_3N_4$ layer and a third $SiO_2$ layer;

FIG. 9 is a sectional view through the substrate shown in FIG. 8 subsequent to the formation of first contacts of the periphery and upper segments of the first lines in the cell field;

FIG. 10 is a sectional view through the substrate shown in FIG. 9 subsequent to the deposition of a first conductive barrier layer, a first ferromagnetic layer, a non-magnetic layer, a second ferromagnetic layer, and a second conductive barrier layer;

FIG. 11 is a sectional view through the substrate shown in FIG. 10 subsequent to the forming of magnetoresistive elements by the structuring of the previously deposited layers using a self-aligning technique based on the formation of spacers, which is described in reference to FIGS. 20 to 22;

FIG. 12 is a sectional view through the substrate shown in FIG. 11 subsequent to the forming of a planarizing insulating layer;

FIG. 13 is a sectional view through the substrate shown in FIG. 12 subsequent to the depositing and structuring of a third $Si_3N_4$ layer and a fourth $SiO_2$ layer;

DESCRIPTION OF THE PREFERRED EMBODIMENTS

Figure 1:
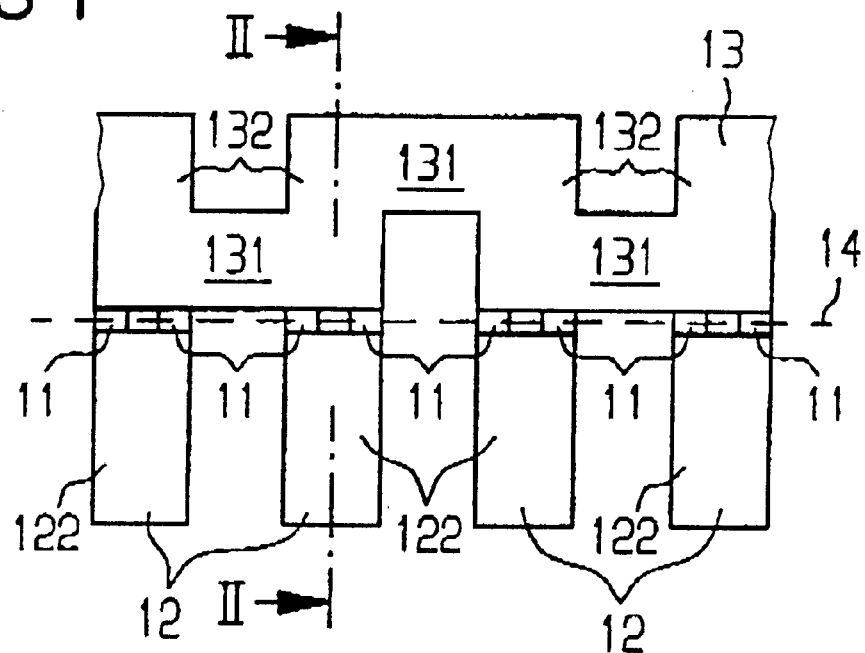
FIG. 1 is a sectional view through a memory cell configuration including annular magnetoresistive elements and first and second lines, each of which includes first portions extending parallel to the layer plane and second portions extending perpendicular to the layer plane.

In all the figures of the drawing, sub-features and integral parts that correspond to one another bear the same reference symbol in each case.

Figure 2:
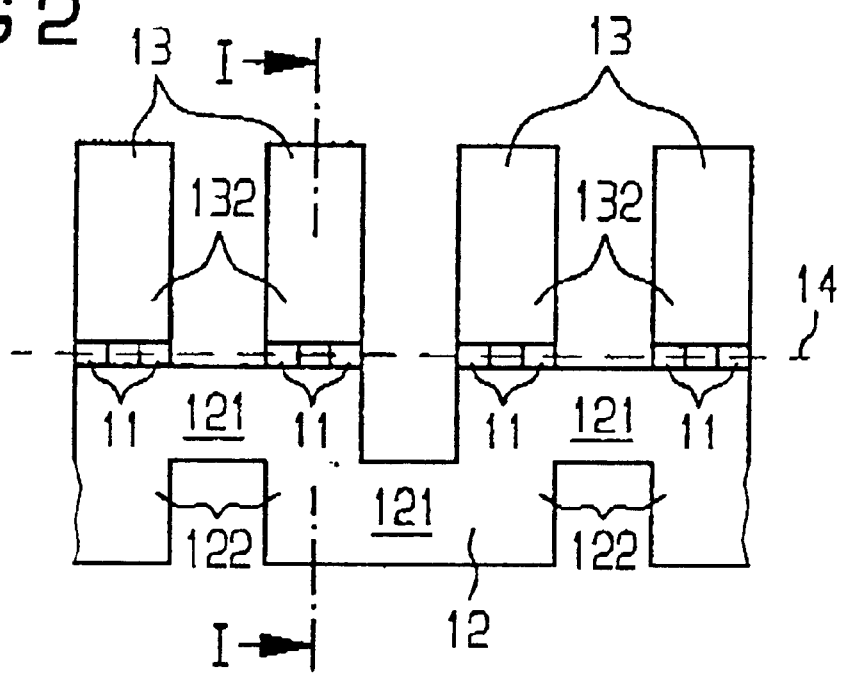
FIG. 2 is a sectional view through the memory cell configuration shown in FIG. 1 taken along line II—II.

Referring now to the figures of the drawings in detail and first, particularly to FIG. 1 thereof, there is shown, in a memory cell configuration, annular magnetoresistive elements 11 are respectively disposed between first lines 12 and second lines 13 (see FIGS. 1 and 2). The magnetoresistive elements have an annular cross-section in a layer plane 14 extending perpendicular to the plane of the figure. The first lines 12 include first portions 121 and second portions 122. The first portions 121 run parallel to the layer plane 14, and the second portions 122 run perpendicular to the layer plane 14. In a corresponding fashion, the second lines 13 include first portions 131 and second portions 132. The first portions 131 run parallel to the layer plane 14, and the second portions 132 run perpendicular to the layer plane 14. When current flows through the first line 12 or the second line 13, a current component that is parallel to the layer plane 14 predominates in the first portions 121 or 131. On the other hand, a current component that is oriented perpendicular to the layer plane 14 predominates in the second portions 122 or 132.

When current flows through the first line 12, vertical current components that flow through the second portions 122 make an azimuthal magnetic field at the location of the magnetoresistive elements 11. Likewise, vertical current components flowing in the second line 13 through the second portions 132 produce an azimuthal magnetic field at the location of the magnetoresistive elements 11. If the first lines and the second lines 13 are poled such that, at the location of the magnetoresistive element 11 that is disposed in the crossing region between one of the first lines 12 and one of the second lines 13, the vertical current components in the respective second line portion 122, 132 flow in the same direction, a constructional overlap of these azimuthal magnetic fields occurs, and the magnetization of the magnetoresistive element 11 disposed in this crossing region can be switched.

Owing to the provision of the first portions 121, 131 and the second portions 122, 132, the first lines 12 and the second lines 13, respectively, have a stepped cross-section in a plane perpendicular to the layer plane 14.

Figure 3:
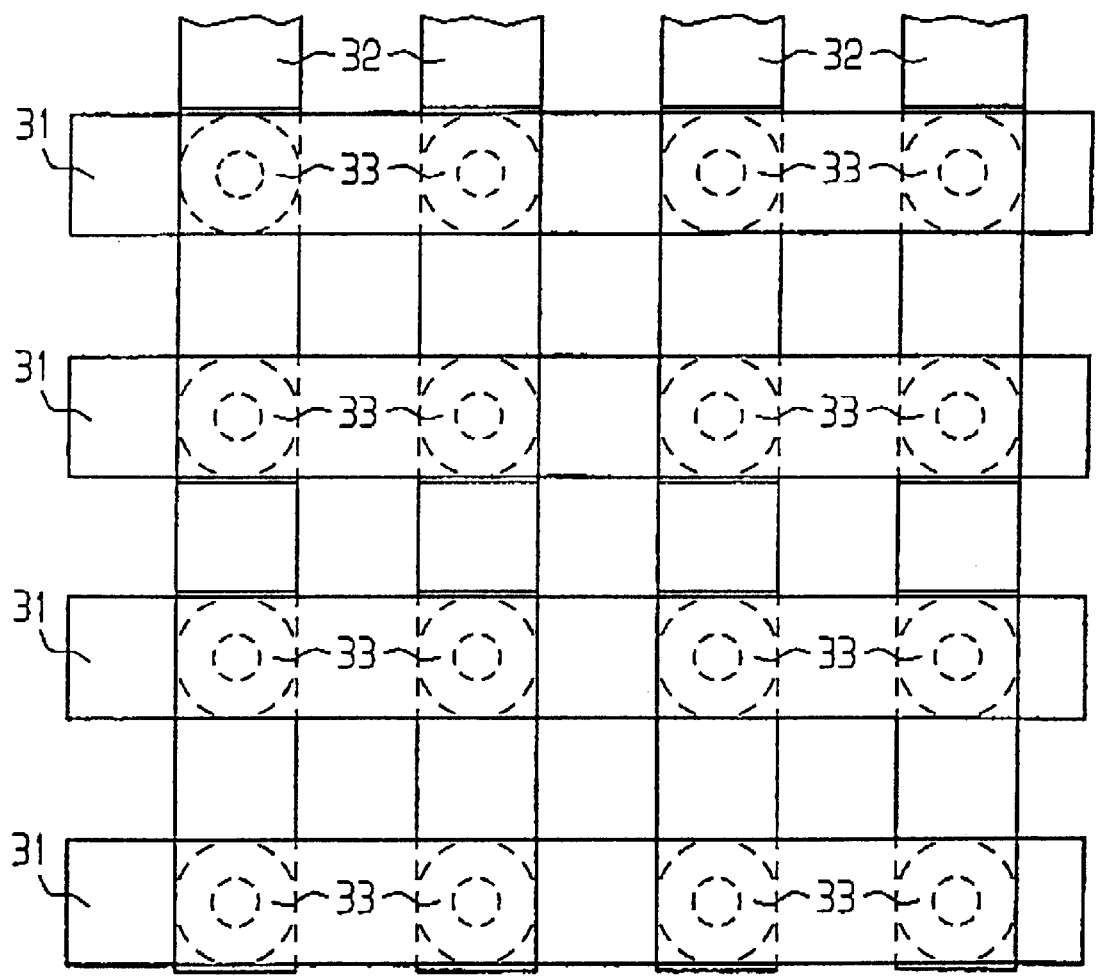
FIG. 3 is a plan view of a memory cell configuration including magnetoresistive annular elements and first and second lines, whose projections on the layer plane are strip-shaped bands.

A memory cell configuration includes first lines 31, which extend parallel to one another, and second lines 32, which also extend parallel to one another and cross the first lines 31 (see FIG. 3). The first lines 31 and the second lines 32 each exhibit a strip-shaped cross-section from above. They have a width of 0.35 μm, a spacing of 0.35 μm, and a length of from 70 to 700 μm, depending on the size of the cell field.

In the crossing region between one of the first lines 31 and one of the second lines 32, a respective magnetoresistive element 33 with an annular cross-section is disposed. The contour of the magnetoresistive element 33 appears as a dotted line in the plan view in FIG. 3, because the second line 32 conceals it.

The first and second lines 31 and 32, respectively, have a stepped cross-section in a section perpendicular to the plane of projection and parallel to the strip-shaped contour, including first line portions extending parallel to the plane of projection, and second portions extending perpendicular to the plane of projection, as described with reference to FIGS. 1 and 2. When current flows through the first line 31 or the second line 32, a current component that is oriented parallel to the annular cross-section predominates in the first line portions. On the other hand, a current component that is perpendicular to the annular cross-section predominates in the second line portions. Above and below each of the magnetoresistive elements 33, a second portion of the appertaining first line 31 and appertaining second line 32 is respectively disposed, in which a current can flow perpendicular to the annular cross-section of the magnetoresistive element 33.

Figure 4:
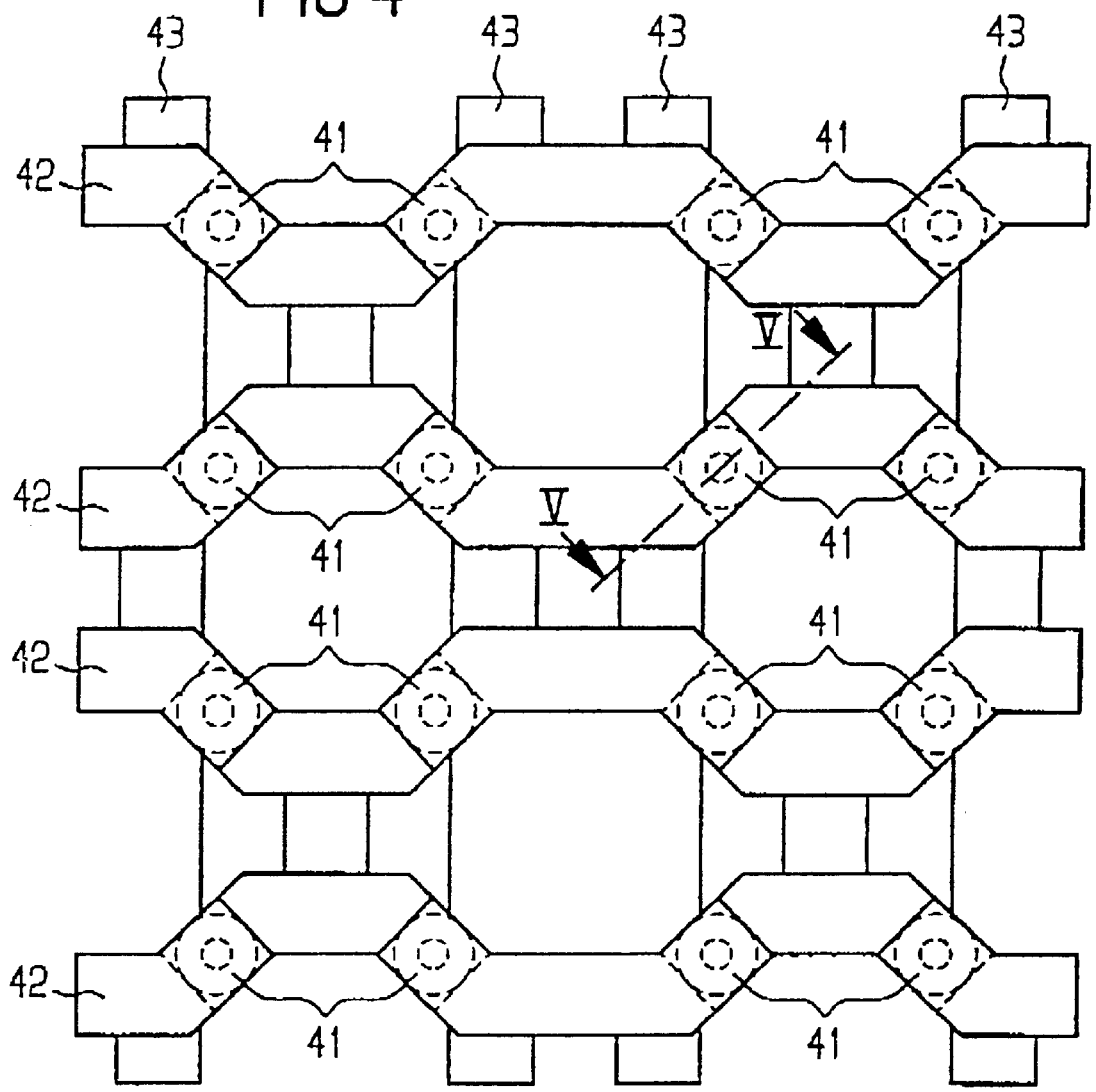
FIG. 4 is a plan view of a memory cell configuration including annular magnetoresistive elements and first and second lines, whose projections on the layer plane are wavy, polygonal bands.

In a memory cell configuration, annular magnetoresistive elements 41 are disposed in rows and columns in a raster configuration in a plane referenced the layer plane (see FIG. 4).

Each of the magnetoresistive elements 41 is disposed between a first line 42 and a second line 43. The projections of the first lines 42 and the second lines 43 on the layer plane are wavy, polygonal strips that contain portions that are parallel to the respective rows and columns. These parallel portions are disposed at an alternating parallel offset relative to the lines through the midpoints of adjoining magnetoresistive elements 41.

Figure 5:
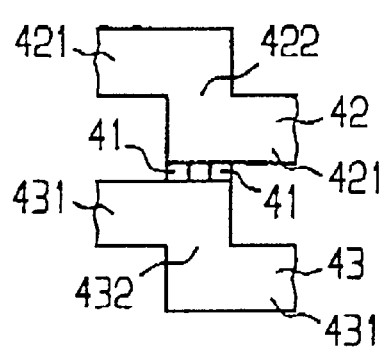
FIG. 5 is a sectional view of the memory cell configuration shown in FIG. 4 taken along line V—V through a magnetoresistive element and the adjoining regions of the appertaining first and second lines.

Perpendicular to the plane of projection, the first lines 42 and the second lines 43 have a stepped cross-section (see FIG. 5, representing the section referenced V—V in FIG. 4). The first line 42 includes a first portion 421 and a second portion 422. The first portion 421 runs parallel to the plane of projection, whereas the second portion 422 runs perpendicular to the plane of projection.

The second line 43 includes a first portion 431 that extends parallel to the plane of projection. The second line 43 also includes a second portion 432 that runs perpendicular to the plane of projection.

Alternating first portions 421, 431 and second portions 422, 432 are disposed along each of the first lines 42 and second lines 43.

Figure 6:
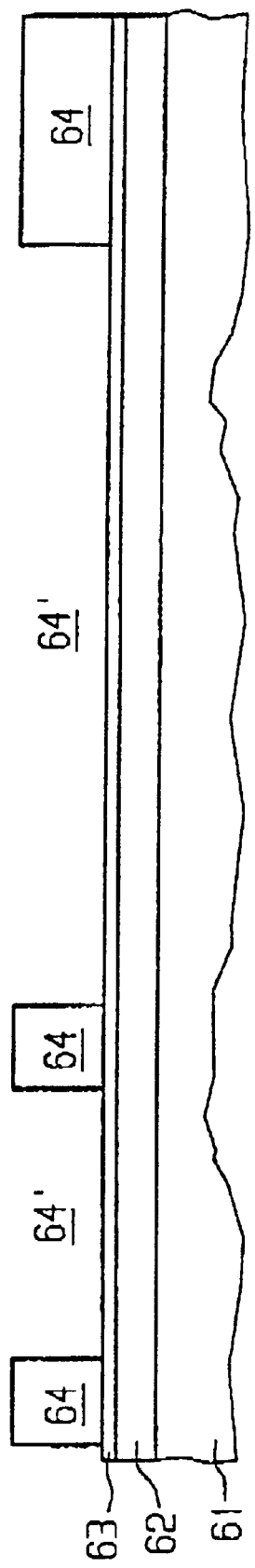
FIG. 6 is a sectional view through a substrate including a first $SiO_2$ layer, a $Si_3N_4$ layer, and a second $SiO_2$ layer.

On a monocrystalline silicon substrate 61 containing such components as MOS transistors, a first $SiO_2$ layer 62 is deposited in a thickness of from 50 to 100 nm, a first $Si_3N_4$ layer 63 is deposited in a thickness of from 30 to 50 nm, and a second $SiO_2$ layer 64 is deposited in a thickness of from 400 to 800 nm (see FIG. 6). Using a photolithographically created photosensitive mask and anisotropic etching, the second $SiO_2$ layer 64 is structured such that trenches 64' are exposed in the second $SiO_2$ layer 64.

Figure 7:
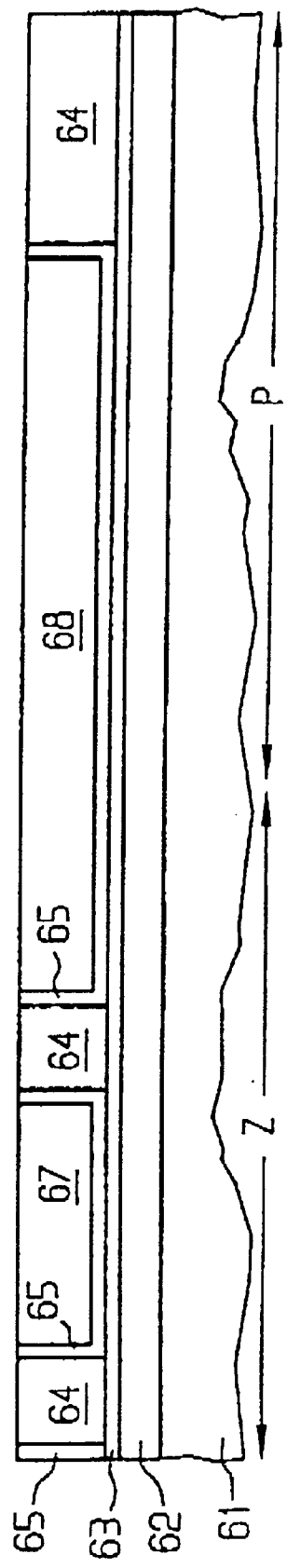
FIG. 7 is a sectional view through the substrate shown in FIG. 6 subsequent to the forming of lower segments of first lines of the cell field and a first metallization plane of the periphery.

This is followed by the surface-wide deposition of a first conductive diffusion barrier layer 65 containing TaN/Ta in a thickness of 50 nm, and a first conductive copper layer. The first conductive copper layer is deposited thick enough to completely fill the trenches 64'. The first conductive diffusion barrier layer 65 and the first conductive layer are structured by chemical-mechanical polishing. The surface of the second $SiO_2$ layer 64 is thereby exposed, the lower segments 67 of a first line are created in the region of a cell field Z, which are embedded in the trenches 64', and lines of a first metallization plane 68 are created in the region of a periphery P (see FIG. 7).

Next, a second $Si_3N_4$ layer 69 is deposited in a thickness of from 30 to 50 nm, and a third $SiO_2$ layer 610 is deposited in a thickness of from 400 to 800 nm, and these are structured using a photolithographically created mask and anisotropic etching (see FIG. 8). This produces trenches 610'.

Next, a second conductive barrier layer 611 and a second conductive layer 612 are deposited surface-wide. The second conductive barrier layer 611 is formed from TaN/Ta in a thickness of 50 nm. The second conductive layer includes copper deposited in a sufficient thickness to fill the trenches 610'. The second conductive layer and the second conductive barrier layer 611 are planarized by CMP, exposing the surface of the second $SiO_2$ layer 610 and creating upper segments of the first line 613, which are embedded in the trenches 610', and first contacts 614 (see FIG. 9). The upper segments 613 of the first line and lower segments 67 of the first line partially overlap.

Next, a first barrier layer 615, a first ferromagnetic layer 616, a non-magnetic layer 617, a second ferromagnetic layer 618, and a second diffusion barrier layer 619 are deposited surface-wide (see FIG. 10). The first diffusion barrier layer 615 and the second diffusion barrier layer 619 are formed from Ta in a thickness of from 10 to 30 nm. The first ferromagnetic layer 616 is formed from Co in a thickness of from 3 to 10 nm. The non-magnetic layer 617 is formed from $Al_2O_3$ in a thickness of from 1 to 3 nm. The second ferromagnetic layer 618 is formed from NiFe in a thickness of from 3 to 10 nm. For the sake of simplicity, FIG. 10 represents the first ferromagnetic layer 616, the non-magnetic layer 617, and the second ferromagnetic layer 618 as a triple layer 616, 617, 618.

With the aid of a mask 620, magnetoresistive elements 621 with an annular cross-section parallel to the surface of the substrate 61 are formed by anisotropically etching the first diffusion barrier layer 615, the first ferromagnetic layer 616, the non-magnetic layer 617, the second ferromagnetic layer 618, and the second diffusion barrier layer 619. The mask 620 is created using a self-aligning technique, which will be described in detail in connection with the FIGS. 20 to 22.

The magnetoresistive elements 621 are surrounded with insulating material by depositing a fourth $SiO_2$ layer 622 and planarizing it by CMP (see FIG. 12).

Next, a third $Si_3N_4$ layer 623 is deposited and structured using a photosensitive mask 624 such that the magnetoresistive elements remain covered by the third $Si_3N_4$ layer 623, while this layer is removed in the region of the periphery (see FIG. 13).

Subsequent to the removal of the photosensitive mask 624, a fifth $SiO_2$ layer 625 is deposited surface-wide in a thickness of from 400 to 800 nm, at the surface of which a photosensitive mask 626 is formed by photolithographic steps.

Figure 14:
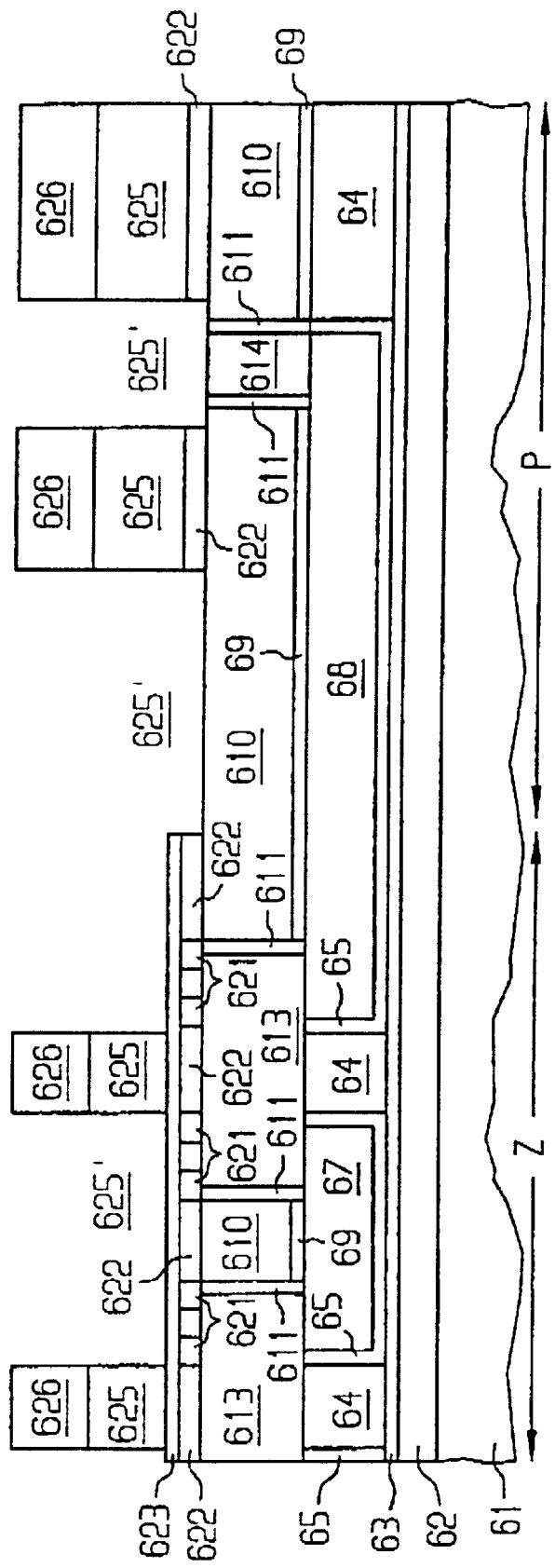
FIG. 14 is a sectional view through the substrate shown in FIG. 13 subsequent to the structuring of the fourth $SiO_2$ layer and the planarizing insulating layer.

With the aid of the photosensitive mask 626, which is used as an etching mask, the fifth $SiO_2$ layer 625 and the fourth $SiO_2$ layer 622 are structured. This step produces trenches 625' (see FIG. 14). The third $Si_3N_4$ layer 623 remains above the magnetoresistive elements 62 (see FIG. 14).

Figure 15:
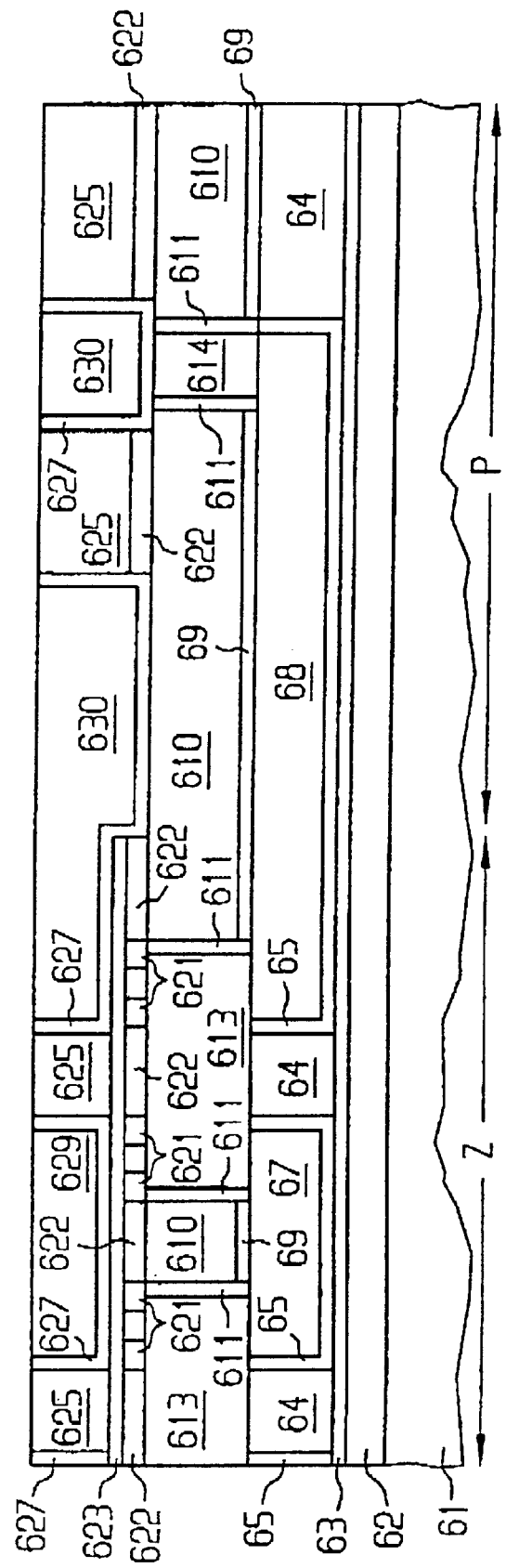
FIG. 15 is a sectional view through the substrate shown in FIG. 14 subsequent to the forming of lower segments of second lines in the cell field and a second metallization plane in the periphery.
Figure 16:
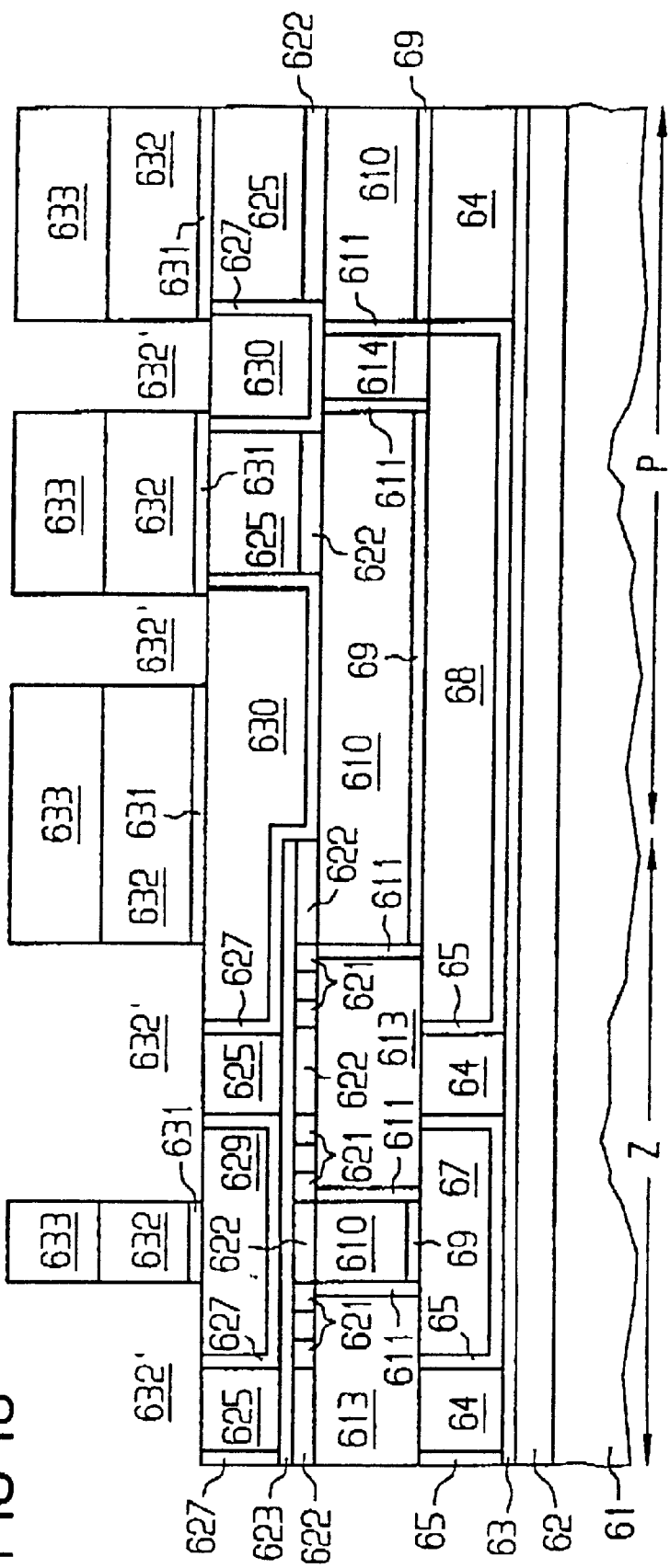
FIG. 16 is a sectional view through the substrate shown in FIG. 15 subsequent to the depositing and structuring of a fourth $Si_3N_4$ layer and a fifth $SiO_2$ layer.

Subsequent to the removal of the mask 626, a third conductive barrier layer 627 and a third conductive layer are deposited, which fill the trenches 625' (see FIG. 15). The third conductive barrier layer 627 is formed from Ta/TaN in a thickness of from 30 to 50 nm. The third conductive layer is formed from copper. The third conductive barrier layer 627 and the third conductive layer are planarized by chemical mechanical polishing. The surface of the fifth SiO$_2$ layer 625 is thereby exposed. A lower segment 629 of a second line is formed in the cell field Z, and a second metallization plane 630 is formed in the periphery P (see FIG. 15). A fourth Si$_3$N$_4$ layer 631 is deposited surface-wide in a thickness of from 30 to 50 nm, and a sixth SiO$_2$ layer 632 is deposited in a thickness of from 400 to 800 nm. Next, a mask 633 of photosensitive resist is produced with the aid of photolithography steps. The sixth SiO$_2$ layer 632 and the fourth Si$_3$N$_4$ layer 631 are structured by anisotropic etching, forming trenches 632' (see FIG. 16).

Figure 17:
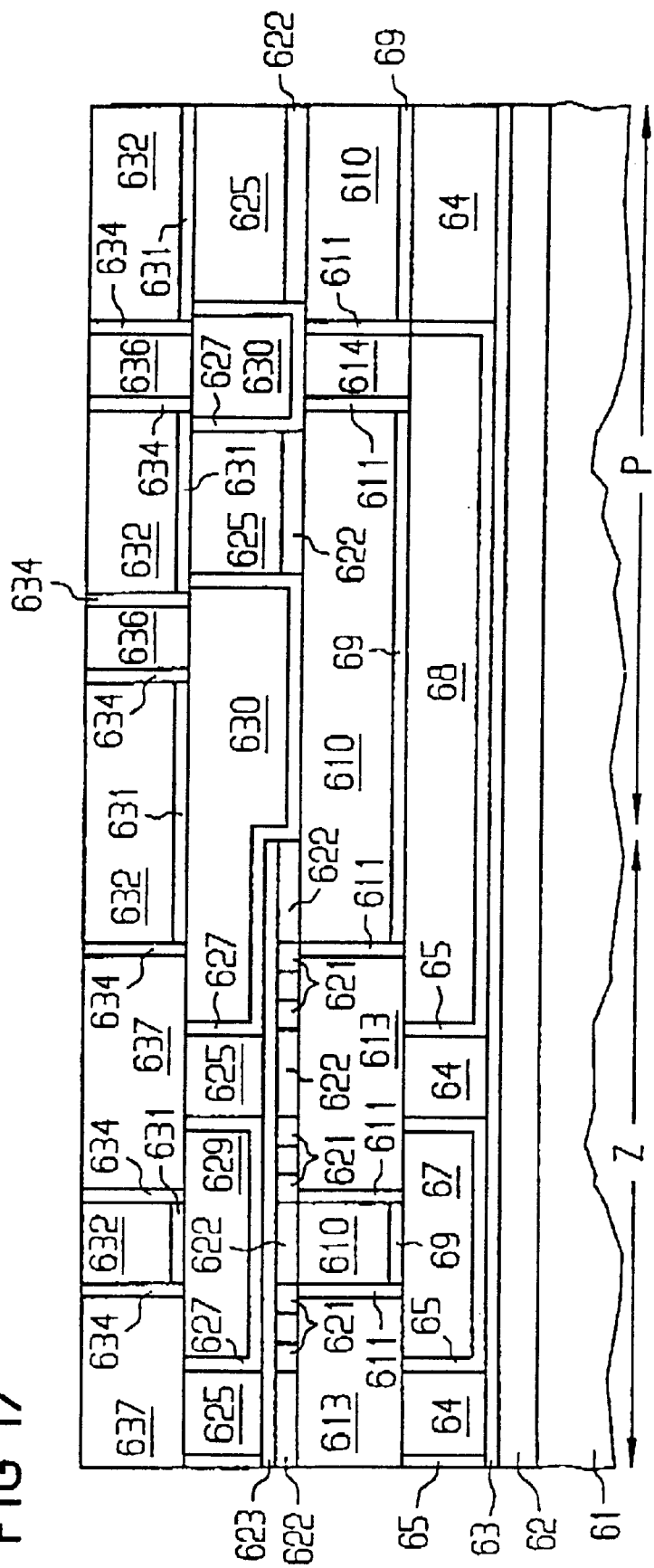
FIG. 17 is a sectional view through the substrate shown in FIG. 16 subsequent to the forming of upper segments of the second lines in the cell field and second contacts of the periphery.

Subsequent to the removal of the mask 633, a fourth conductive barrier layer 634 and a fourth conductive layer are deposited at the sidewalls of the trenches, filing the trenches 632'. The fourth conductive barrier layer 634 is formed from TaN/Ta in a thickness of 50 nm. The bottom of the trenches is exposed by sputtering and/or RIE techniques. The fourth conductive layer is formed from copper in a sufficient thickness to fill the trenches 632 completely. The fourth conductive barrier layer 634 and the fourth conductive layer are planarized by CMP, thereby exposing the surface of the sixth SiO$_2$ layer 632. At the same time, second contacts 636 are formed from the fourth conductive layer in the periphery P, and upper segments 637 of the second line are formed from the same layer in the cell field Z (see FIG. 17).

Figure 18:
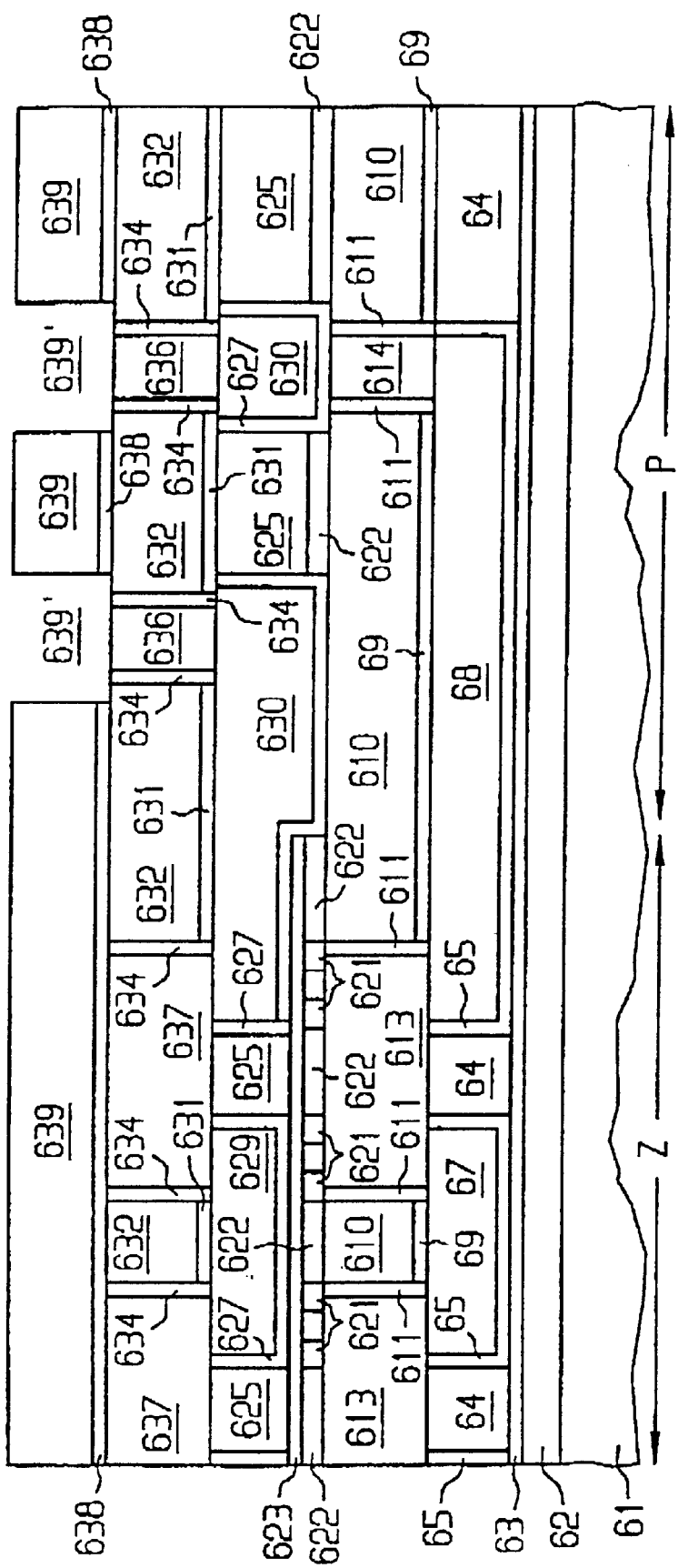
FIG. 18 is a sectional view through the substrate shown in FIG. 17 subsequent to the deposition and structuring of a fifth $Si_3N_4$ layer and a sixth $SiO_2$ layer.

This is followed by the depositing and structuring of a fifth Si$_3$N$_4$ layer 638 in a thickness of from 30 to 50 nm, and a seventh SiO$_2$ layer 639 in a thickness of from 400 to 800 nm. In the structuring process with the aid of a photosensitive mask and anisotropic etching, trenches 639 are exposed, which extend to second contacts 636 (see FIG. 18).

Figure 19:
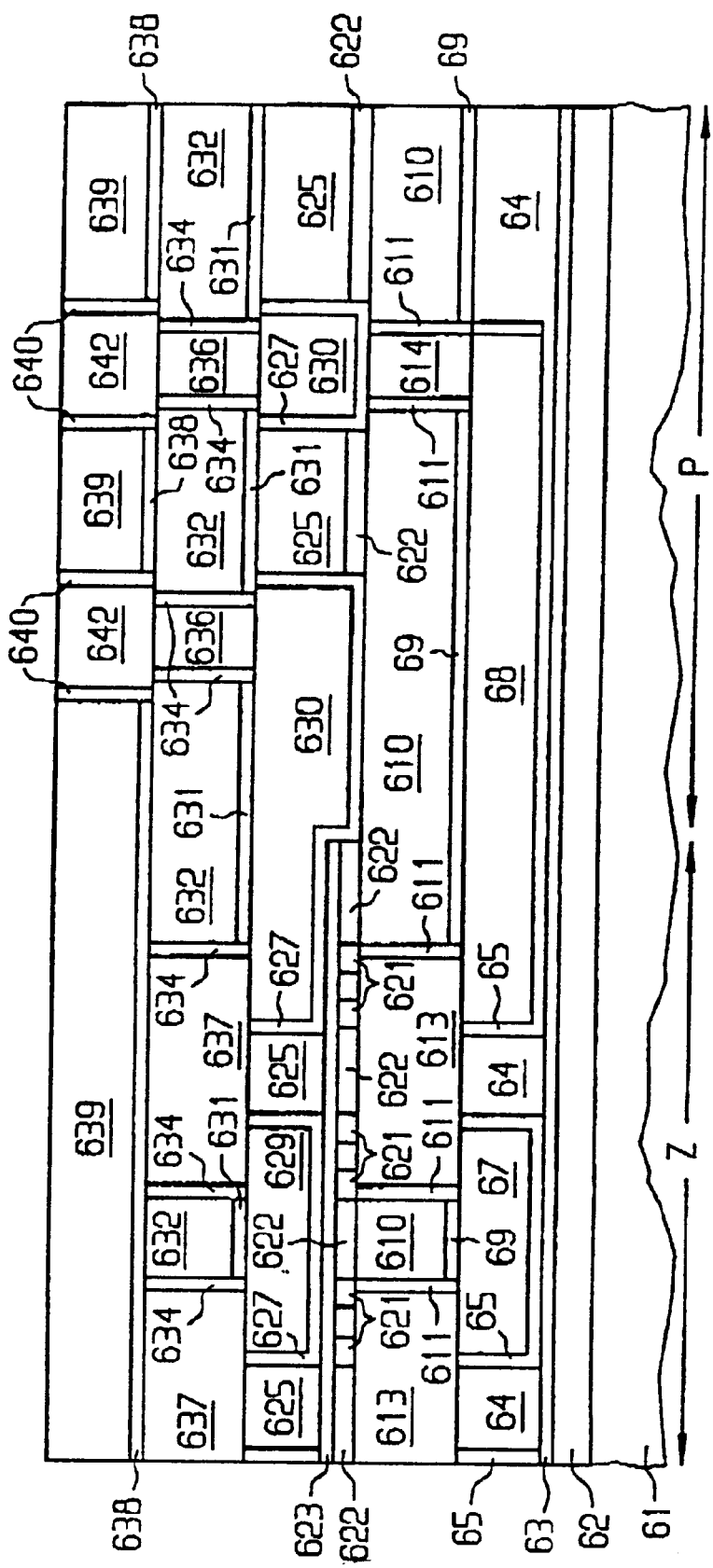
FIG. 19 is a sectional view through the substrate shown in FIG. 18 subsequent to the forming of a third metallization plane.

The trenches 639' are filled with a third metallization plane 642 by depositing and planarizing, by CMP, a fifth conductive barrier layer 640 containing Ta/TaN in a thickness of from 30 to 50 nm and a fifth conductive layer containing copper (see FIG. 19).

Figure 20:
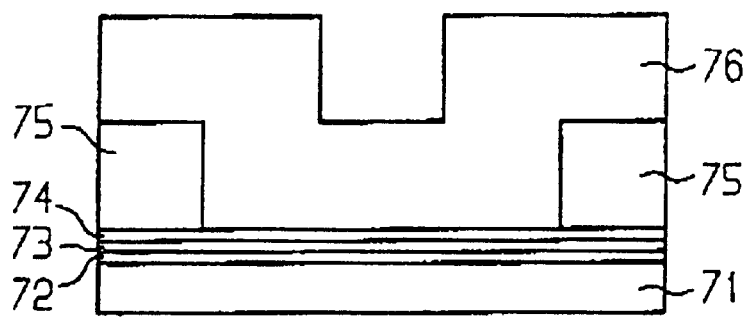
FIG. 20 is a sectional view through a substrate including an upper segment of the first line, subsequent to the deposition of a first ferromagnetic layer, a non-magnetic layer, and a second ferromagnetic layer, and subsequent to the deposition and structuring of an auxiliary layer and the deposition of a conformal layer.

A first ferromagnetic layer 72 containing Co in a thickness between 3 and 10 nm, a non-magnetic layer 73 containing Al$_2$O$_3$ in a thickness of from 1 to 3 nm, and a second ferromagnetic layer 74 containing NiFe in a thickness between 3 to 10 nm are deposited on a substrate 71, which includes a diffusion barrier layer in the region of the surface (see FIG. 20).

On the second ferromagnetic layer 74, an auxiliary layer 75 containing Si$_3$N$_4$ is deposited in a thickness of from 50 to 100 nm and structured with the aid of a photosensitive mask (which is not represented). An opening in the auxiliary layer 75 is thus created, in which the surface of the second ferromagnetic layer 74 is exposed.

Next, a conformal layer 76 containing SiO$_2$ or Ta in a thickness of from 80 to 120 nm is formed.

Figure 21:
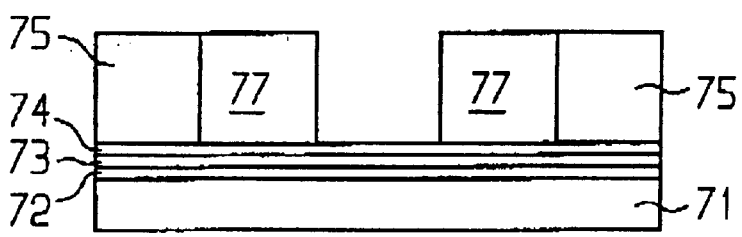
FIG. 21 is a sectional view through the substrate shown in FIG. 20 subsequent to the anisotropic etching of the conformal layer, which produces a spacer-shaped mask.
Figure 22:
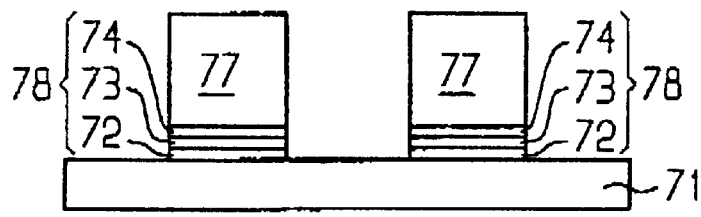
FIG. 22 is a sectional view through the substrate shown in FIG. 21 subsequent to the removal of the structured auxiliary layer and the formation of magnetoresistive elements by structuring the first ferromagnetic layer, the non-magnetic layer, and the second ferromagnetic layer.
Figure 23:
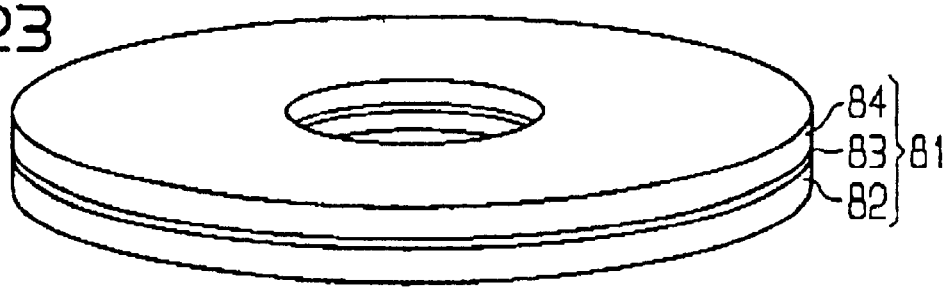
FIG. 23 is an elevational view of a magnetoresistive element including annular layer elements.

A spacer 77, which is annular conditional to its production, is formed from the conformal layer 76 by anisotropic etching (RIE) with reaction gasses containing F or Cl (see FIG. 21). Upon the removal of the structured auxiliary layer 75, the 11 spacer 77 is used as an etching mask, in order to structure the second ferromagnetic layer 74, the non-magnetic layer 73, and the first ferromagnetic layer 72 (potentially including the diffusion barriers, which are not represented in the FIGS. ). An annular magnetoresistive element 78 is thereby formed. If the spacer 77 was formed from Ta, which exhibits a diffusion barrier effect, it can be used as the diffusion barriers in the memory cell configuration.

A magnetoresistive element 81, which include an annular crosssection, contains at least one first ferromagnetic layer element 82, one non-magnetic layer element 83, and one second ferromagnetic layer element 84, which are disposed as a stack. The first ferromagnetic layer element 82 has a thickness of from 3 to 10 nm, an outer diameter of 350 nm, and an inner diameter of from 100 to 190 nm, and contains Co. The non-magnetic layer element 83 has a thickness of from 1 to 3 nm and contains Al$_2$O$_3$. The second ferromagnetic layer element 84 has a thickness of between 3 and 10 nm and contains NiFe. The non-magnetic layer element 83 and the second ferromagnetic layer element 84 have the same cross-section as the first ferromagnetic layer element.

The first ferromagnetic layer element 82 and the second ferromagnetic layer element 84 can have a clockwise or counter-clockwise magnetization, respectively. If the direction of magnetization of the first ferromagnetic layer element 82 matches that of the second ferromagnetic layer element 82, the magnetoresistive element 81 has a smaller resistance than if the magnetizations of the first ferromagnetic layer element 82 and the second ferromagnetic layer element 84 are oriented in opposite directions.

To amplify the vertical components of the write currents in the first and second lines and the azimuthal magnetic fields they generate at the location of the storage elements, to spare a photolithographic structuring plane, and to provide reliable lateral insulation of the magnetoresistive elements, the processing sequence described with reference to FIGS. 6 to 19 can be modified in the following ways:

The second SiO$_2$ layer 64 is deposited with larger thickness (e.g. by a factor of 2). This results in deeper trenches 62' and correspondingly thicker lower segments 67 of the first lines subsequent to the CMP step. By the wet chemical etch-back of copper (e.g. using ammonium peroxodisulfate ((NH$_4$)$_2$S$_2$O$_6$), the surface of these segments is lowered below that of the second SiO$_2$ layer 64, so that the trenches 64' are only partly filled (e.g. only halfway). Next, the second Si$_3$N$_4$ layer 69 and the third SiO$_2$ layer 610 are deposited. The additional processing steps are performed substantially without modification, up to and including the completion of the upper segments 613 of the first lines.

Subsequent to the structuring of the magnetoresistive elements 621, in which the ring structure of these elements is created with the aid of self-aligning spacers, the fourth SiO$_2$ layer 622 is etched back by an anisotropic RIE technique (e.g. using etching gasses containing C and F), so that the magnetoresistive elements 621 are insulated laterally by SiO$_2$ spacers. Next, the third Si$_3$N$_4$ layer 623 is deposited optimally conformally. Without the structuring of this layer, the fifth SiO$_2$ layer 625 for the lower segments of the second lines is deposited and planarized by a short CMP step. Next, the fifth SiO$_2$ layer 625 is selectively structured with respect to the third Si$_3$N$_4$ layer 623, and this is selectively structured with respect to the SiO$_2$ spacers of the fourth SiO$_2$ layer 622.

All other processing steps are carried out as described above, whereby the vertical components of the write current in the second lines are amplified analogously to those of the first lines.

I claim:
1. A memory cell configuration, comprising:
a first line;
a second line crossing said first line, said first line and said second line defining a crossing region; and
a magnetoresistive element disposed in said crossing region and having an annular cross-section in a layer plane and layer elements stacked perpendicular to the layer plane;

said first line and said second line being disposed in said crossing region on opposing sides of said magnetoresistive element relative to the layer plane;

at least one of said first line and said second line including at least one first portion having a predominant current component oriented parallel to the layer plane and one second portion having a predominant current component oriented perpendicular to the layer plane, in said crossing region.

2. The memory cell configuration according to claim 1, wherein at least one of said first portion of said first line and said first portion of said second line extends parallel to the layer plane, and at least one of said second portion of said first line and said second portion of said second line intersects a plane situated parallel to the layer plane in the crossing region between said first line and said second line.

3. The memory cell configuration according to claim 1, wherein at least one of said second line portion of said first line and said second line portion of said second line extends perpendicular to the layer plane.

4. The memory cell configuration according to claims 1, wherein said first line and said second line each include a first portion and a second portion with a respective predominant current component; the predominant current components being oriented parallel and perpendicular to the layer plane, respectively.

5. The memory cell configuration according to claim 1, wherein said magnetoresistive element is interposed between said first line and said second line.

6. The memory cell configuration according to claim 1, wherein the magnetoresistive element includes a first ferromagnetic layer element, a non-magnetic layer element, and a second ferromagnetic layer element, said non-magnetic layer element being disposed between said first ferromagnetic layer element and said second ferromagnetic layer element.

7. The memory cell configuration according to claim 6, wherein said first ferromagnetic layer element and said second ferromagnetic layer element contain a metal selected from the group consisting of Fe, Ni, Co, Cr, Mn, Bi, Gd, and Dy.

8. The memory cell configuration according to claim 6, wherein said first ferromagnetic layer element and said second ferromagnetic layer element have a thickness between 2 and 20 nm perpendicular to the layer plane.

9. The memory cell configuration according to claim 6, wherein said non-magnetic layer element contains a metallic compound selected from the group consisting of $Al_2O_3$, NiO, $HfO_2$, $TiO_2$, NbO, $SiO_2$, Cu, Au, Ag, and Al.

10. The memory cell configuration according to claim 6, wherein said non-magnetic layer element has a thickness between 1 and 5 nm perpendicular to the layer plane.

11. The memory cell configuration according to claim 6, wherein said first ferromagnetic layer element, said second ferromagnetic layer element, and said non-magnetic layer element have dimensions between 50 and 1000 nm parallel to the layer plane.

12. The memory cell configuration according to claim 1, including:

a plurality of identical first lines and identical second lines, said first lines crossing said second lines; and a plurality of identical magnetoresistive elements disposed in a matrix, each of said respective magnetoresistive elements being disposed in the crossing region between one of said first lines and said second lines;

at least one of said first lines and said second lines including first portions, in which the predominant current component is oriented parallel to the layer plane, and second portions, in which the predominant current component is oriented perpendicular to the layer plane, in an alternating fashion.

13. The memory configuration according to claim 12, in which said first line portions and said second line portions of at least one of said first line and said second line is disposed with the appertaining line exhibiting a strip-shaped cross-section in a plane parallel to the layer plane.

14. The memory cell configuration according to claim 12, wherein:

connecting lines connecting adjoining magnetoresistive elements;

said magnetoresistive elements are disposed in rows and columns, the layer plane spreading toward the rows and columns;

a projection of the first portions of each of the first lines on the layer plane is disposed between adjoining magnetoresistive elements of one of the rows, at an offset relative to one of said connecting lines between the adjoining magnetoresistive elements;

a projection of the first portions of each of the second lines on the layer plane is disposed between adjoining magnetoresistive elements of one of the columns, at a lateral offset relative to one of said connecting lines between the adjoining magnetoresistive elements;

said projections on the layer plane of said first line portions, which adjoin one another along one of said lines, are offset on opposite sides relative to the respective connecting lines.

15. A method for producing a memory cell configuration, which comprises:

creating a first line on a main surface of a substrate; forming a magnetoresistive element having an annular cross-section in a layer plane by depositing and structuring a first ferromagnetic layer, a non-magnetic layer, and a second ferromagnetic layer;

disposing the magnetoresistive element in the crossing region by creating a second line crossing the first line;

creating at least one of said first line and said second line in the overlap region;

including a first portion of said at least one of said first line and said second line in the overlap region with a predominant current component oriented parallel to the layer plane, and a second portion with a predominant current component oriented perpendicular to the layer plane.

16. The method according to claim 15, which further comprises structuring the first ferromagnetic layer, the non-magnetic layer, and the second ferromagnetic layer with a spacer-shaped mask.

17. The method according to claim 15, which further comprises:

forming the first line by depositing a first conductive layer; and forming a lower region of the first line and a first metallization plane in a periphery from the conductive layer;

depositing a second conductive layer;

forming an upper region of the first line and first contacts in the periphery;

forming the second line by depositing a third conductive layer;

forming a lower region of the second line and a second metallization plane in the periphery;

depositing a fourth conductive layer; and forming from the fourth conductive layer an upper region of the second line and second contacts in the periphery.

18. The method according to claim 17, which further comprises:

prior to the deposition of the first conductive layer, depositing a first insulating layer;

removing the first conductive layer, using photolithographic steps, in regions of the subsequently produced first metallization planes and in regions of the lower regions of the first line;

planarizing the first conductive layer;

prior to the depositing of the second conductive layer, depositing a second insulating layer, and removing the second insulating layer using photolithographic processing in regions of the subsequently produced first contacts and in regions of the upper regions of the first line;

planarizing the second conductive layer;

prior to the depositing of the third conductive layer, depositing a third insulating layer, and removing the third insulating layer with photolithographic processing in regions of the subsequently produced second metallization plane and in regions of the lower regions of the second line;

planarizing the third conductive layer;

prior to the depositing of the fourth conductive layer, depositing a fourth insulating layer, and removing the fourth insulating layer with photolithographic processing in regions of the subsequently produced second contacts and in regions of the upper region of the second line; and planarizing the second conductive layer.

19. The method according to claim 17, which further comprises forming a third metallization plane in the periphery subsequent to production the second line and depositing the fifth conductive layer.

* * * * *